US010610983B2

(12) United States Patent
Melius et al.

(10) Patent No.: US 10,610,983 B2
(45) Date of Patent: Apr. 7, 2020

(54) COOLING PLASMA CUTTING SYSTEMS AND RELATED SYSTEMS AND METHODS

(71) Applicant: Hypertherm, Inc., Hanover, NH (US)

(72) Inventors: Brenda Melius, Acworth, NH (US); Brian J. Currier, Newport, NH (US); Girish R. Kamath, Lebanon, NH (US)

(73) Assignee: Hypertherm, Inc., Hanover, NH (US)

( * ) Notice: Subject to any disclaimer, the term of this patent is extended or adjusted under 35 U.S.C. 154(b) by 101 days.

(21) Appl. No.: 15/584,848

(22) Filed: May 2, 2017

(65) Prior Publication Data
US 2017/0312863 A1 Nov. 2, 2017

Related U.S. Application Data (60) Provisional application No. 62/330,387, filed on May 2, 2016.

(51) Int. Cl.
| | |
|---|---|
| *H05H 1/28* | (2006.01) |
| *B23K 37/00* | (2006.01) |
| *B23K 9/10* | (2006.01) |
| *H05H 1/36* | (2006.01) |
| *B23K 10/00* | (2006.01) |
| *H05K 7/20* | (2006.01) |
| *H05K 5/02* | (2006.01) |

(52) U.S. Cl.
CPC .......... *B23K 37/003* (2013.01); *B23K 9/1006* (2013.01); *B23K 10/00* (2013.01); *B23K 10/006* (2013.01); *H05H 1/28* (2013.01); *H05H 1/36* (2013.01); *H05K 5/0213* (2013.01); *H05K 5/0239* (2013.01); *H05K 7/20909* (2013.01)

(58) Field of Classification Search
CPC ...... H05H 1/28; B23K 9/1006; B23K 37/003; H05K 5/0213; H05K 5/0239; H05K 7/20909
USPC ............................ 219/531; 165/59; 454/184
See application file for complete search history.

(56) References Cited

U.S. PATENT DOCUMENTS

| | | | |
|---|---|---|---|
| 5,624,589 A | 4/1997 | Latvis et al. | |
| 5,747,773 A * | 5/1998 | Griffin | B23K 9/1006 219/130.1 |
| 5,760,361 A * | 6/1998 | Dew | B23K 9/1006 219/108 |

(Continued)

FOREIGN PATENT DOCUMENTS

| | | |
|---|---|---|
| CN | 205960942 U | 2/2017 |
| EP | 1022085 A2 | 7/2000 |

*Primary Examiner* — Matthew W Jellett
(74) *Attorney, Agent, or Firm* — Proskauer Rose LLP (57) ABSTRACT

In some aspects, power supplies for liquid cooled plasma cutting systems configured to support plasma arc generation by a torch head connected to the power supply can include: a set of electrical components for plasma arc generation; and a power supply housing containing the set of electrical components, the power supply housing having a front panel and at least two side panels and defining: a set of inlets for allowing a cooling gas to enter the power supply housing to thermally regulate the set of electrical components, at least one inlet of the set of inlets being positioned at a corner of the housing and oriented at a non-zero angle relative to the front panel and to at least one of the two side panels; and a set of vents for allowing at least a portion of the cooling gas to exit the power supply housing.

25 Claims, 5 Drawing Sheets

(56) References Cited

U.S. PATENT DOCUMENTS

| | | | | |
|---|---|---|---|---|
| 6,081,423 A | * | 6/2000 | Griffin | B23K 9/1006 361/688 |
| 6,767,281 B2 | * | 7/2004 | McKee | F24F 7/02 454/366 |
| 6,888,099 B1 | | 5/2005 | Schneider | |
| 7,369,407 B2 | * | 5/2008 | Kim | H05K 7/20972 345/60 |
| 7,973,628 B1 | * | 7/2011 | MacLennan | H01F 3/14 336/55 |
| 8,395,074 B2 | * | 3/2013 | Winn | B23K 9/1006 219/121.39 |
| 2008/0061047 A1 | | 3/2008 | Borowy et al. | |

\* cited by examiner

COOLING PLASMA CUTTING SYSTEMS AND RELATED SYSTEMS AND METHODS

RELATED APPLICATIONS

This application claims the benefit of U.S. Provisional Patent Application Ser. No. 62/330,387 filed May 2, 2016, entitled "Gas Circulation for a Plasma Arc Cutting System," the contents of which are hereby incorporated herein by reference in their entirety.

TECHNICAL FIELD

This disclosure relates generally to plasma cutting systems, and more specifically to cooling plasma cutting systems and related systems and methods.

BACKGROUND

Plasma arc cutting torches are widely used in the cutting, gouging and marking of materials. A plasma arc torch generally includes an electrode, a nozzle having a central exit orifice mounted within a torch body, electrical connections, passages for cooling, and passages for arc control fluids (e.g., plasma gas). Optionally, a swirl ring is employed to control fluid flow patterns in the plasma chamber formed between the electrode and the nozzle. In some torches, a retaining cap can be used to maintain the nozzle and/or swirl ring in the plasma arc torch. In operation, a plasma arc torch produces a plasma arc, which is a constricted jet of mostly ionized gas with high temperature and that can have sufficient momentum to assist with removal of molten metal. A plasma cutting system can include at least one plasma arc torch, a power source for supplying power to the plasma arc torch, and a gas source for supplying a gas (e.g., air) to the plasma arc torch to support various torch operations.

Plasma arc cutting systems can include a number of electrical components (e.g., PCBs, IGBTs, Magnetics, etc.) in a power supply, which can generate heat during operation. This heat can lead to system inefficiencies and even component/system failures. As such, the power supply itself is typically thermally regulated (e.g., cooled). Current power supplies can employ vents on one side or wall of the power supply and fans to pull and push air through the vent and throughout the system to cool the components during operation.

SUMMARY

In some aspects, a power supply for a liquid cooled plasma cutting system configured to support generation of a plasma arc by a torch head connected to the power supply by a torch lead, can include a set of electrical components for plasma arc generation; and a power supply housing containing the set of electrical components, the power supply housing having a front panel and at least two side panels and defining: a set of inlets for allowing a cooling gas to enter the power supply housing to thermally regulate the set of electrical components, at least one inlet of the set of inlets being positioned at a corner of the housing and oriented at a non-zero angle relative to the front panel and to at least one of the two side panels; and a set of vents for allowing at least a portion of the cooling gas to exit the power supply housing.

Embodiments can include one or more of the following features.

The power supply can include a liquid coolant system disposed within the power supply housing and configured to thermally regulate the torch head. The set of electrical components can include a set of system magnetics disposed horizontally within a lower cooling circuit of the power supply and a set of control circuitry disposed in a first upper cooling circuit of the power supply, where the liquid coolant system is disposed in a second upper cooling circuit arranged horizontally relative to the first upper cooling circuit.

The power supply can include a thermal regulation system disposed within the power supply housing and configured to generate a cooling flow of the cooling gas within the housing and direct it along the set of electrical components. The thermal regulation system can include at least one fan and one or more baffles formed within the housing. The thermal regulation system can include a central plenum in fluid communication with the set of inlets, a first cooling circuit fluidly connected to, and receiving a supply of the cooling gas from, the central plenum for thermal regulation of electrical components including system magnetics; and a second cooling circuit fluidly connected to, and receiving a supply of the cooling gas from, the central plenum for thermal regulation of a liquid coolant system of the power supply to thermally regulate the torch head. The thermal regulation system can include a third cooling circuit for thermal regulation of controls of the power supply. The first cooling circuit and/or the second cooling circuit can include a cross-sectional area or shape that varies between the inlet and the vent. The first cooling circuit and/or the second cooling circuit can include at least one dedicated fan configured to drive the cooling gas through the respective cooling circuit.

The set of electrical components can include a set of magnetic components, where the magnetic components can be configured to allow the cooling gas to flow therethrough. The magnetic components can include an inductor coil wound to define a duct to promote cooling of the magnetic components and to allow the cooling gas to flow therethrough.

At least one inlet of the set of inlets can include a portion with a diminishing flow area. The portion with a diminishing flow area is disposed at an upper or lower end of the inlet.

The positioning and orientation of the at least one inlet of the set of inlets positioned at a corner of the housing and oriented at a non-zero angle relative to the front panel and to at least one of the two side panels can facilitate abutting the power supply in direct contact with at least one of an adjacent power supply or a wall structure along at least one of the front panel or side panels. At least one of the vents is positioned at a corner of the housing and oriented at a non-zero angle relative to the front panel and to at least one of the two side panels.

In some aspects, a plasma cutting system configured to support generation of a plasma arc by a torch head connected to a power supply by a torch lead can include: a power supply having: a set of electrical components for plasma arc generation; and a power supply housing containing the set of electrical components, the power supply housing having a front panel and at least two side panels and defining: a set of inlets for allowing a cooling gas to enter the power supply housing and thermally regulate the set of electrical components, the set of inlets being oriented at a non-zero angle relative to the front panel and to at least one of the two side panels; a set of vents for allowing at least a portion of the cooling gas to exit the power supply housing, at least one vent of the set of vents being oriented at a non-zero angle relative to the front panel and to at least one of the two side panels; and a thermal regulation system disposed within the power supply housing and configured to generate a cooling flow of the cooling gas within the housing and direct it along the set of electrical components, the thermal regulation system having: a central plenum in fluid communication with the set of inlets, a first cooling circuit fluidly connected to, and receiving a supply of the cooling gas from, the central plenum for thermal regulation of electrical components comprising system magnetics; and a second cooling circuit fluidly connected to, and receiving a supply of the cooling gas from, the central plenum for thermal regulation of a liquid coolant system of the power supply to thermally regulate the torch head.

In some aspects, a method of selectively thermally regulating one or more components within a power supply for a plasma cutting system configured to support generation of a plasma arc by a torch head connected to the power supply by a torch lead can include: drawing a cooling gas through one or more inlets of a power supply housing into a plenum at least partially defined by the housing, at least one inlet being oriented at a non-zero angle relative to a front panel and at least one side panel of the housing; causing at least a portion of the cooling gas to be drawn through a first cooling circuit fluidly connected to at least one of the inlets for thermal regulation of a set of electrical components of the power supply; causing at least a portion of the cooling gas to be drawn through a second cooling circuit fluidly connected to at least one of the inlets for thermal regulation of a second set of components of the power supply that is exclusive of the set of electrical components within the first cooling circuit, the second cooling circuit being separated from the first cooling circuit; and expelling the cooling gas from the housing through at least one vent defined along the housing.

Embodiments can include one or more of the following features.

The set of electrical components in the first cooling circuit can include a set of system magnetics and the second set of components in the second cooling circuit comprises liquid coolant handling components.

The causing at least a portion of the cooling gas to be drawn through the second cooling circuit can include causing the cooling gas to flow through the second cooling circuit at a different rate than the cooling gas flowing through the first cooling circuit.

The thermal regulation of the system magnetics can include flowing a portion of the cooling gas through the first cooling circuit through an inductor coil wound to define a duct.

In some examples, the drawing the cooling gas through one or more inlets of a power supply housing into a plenum includes drawing cooling gas though two inlets into a common plenum; the causing at least a portion of the cooling gas to be drawn through a first cooling circuit comprises drawing a portion of the cooling gas from the common plenum into the first circuit; and the causing at least a portion of the cooling gas to be drawn through a second cooling circuit includes drawing a second portion of the cooling gas from the common plenum into the second circuit.

Embodiments described herein can have one or more of the following advantages.

In some aspects, the systems and methods described herein can provide better cooling than some conventional plasma cutting systems, such as those with cooling vents on only one wall of the power supply. For example, the location of a single vent can dictate where the power supply can be located in operation, such as in a shop or manufacturing environment. For example, due to location of a vent along a front or side panel of the power supply, the power supply typically needs to be spaced away from facility walls and other objects so that enough air can be drawn in through the vent. Absent such spacing and air flow, the conventional systems may lack sufficient cooling. Thus, some conventional systems can require at least about 36 inches of clearance of wall spacing around the power supply in order to provide adequate cooling. Whereas, the systems described herein having vents arranged at non-zero angles relative to side and front panels can be positioned closer to (e.g., in contact with) a wall or other object, such as an adjacent system.

Additionally, the systems and methods described herein can provide more selective, customized (e.g., on-demand) cooling of various components than some conventional plasma cutting systems, such as those that locate the electronics (e.g., inductors, transformers, PCBs, etc.) all in one compartment within the housing and cooling them with a single fan. For example, arranging different electronics in different cooling circuits, and in some cases with dedicated cooling fans, the systems and methods described herein can cool certain components in individual cooling circuits (e.g., compartments) with various cooling gas flow properties depending on their cooling requirements. In some cases, this can provide more efficient cooling, as gas flows can be customized using different fans, to accommodate and reduce the impact of design architecture, component selection, and component and power supply orientation, which can negatively impact cooling ability and efficiency in systems having one cooling compartment.

In some aspects, the more customized, on-demand cooling can provide for more efficient cooling of components within the power supply. Due to the more efficient cooling, the systems described herein can be configured and manufactured to be smaller and lighter than some power-equivalent systems. For example, the systems described herein can be lighter per kilowatt relative to some other systems.

DETAILED DESCRIPTION

In some aspects, plasma arc power supplies can include multiple cooling circuits that each house different sets of types of components that can have different operational characteristics and cooling requirements. As such, the different cooling circuits can be configured to provide different cooling flows so that the different components can cooled at different (e.g., customized) cooling rates.

Figure 1:
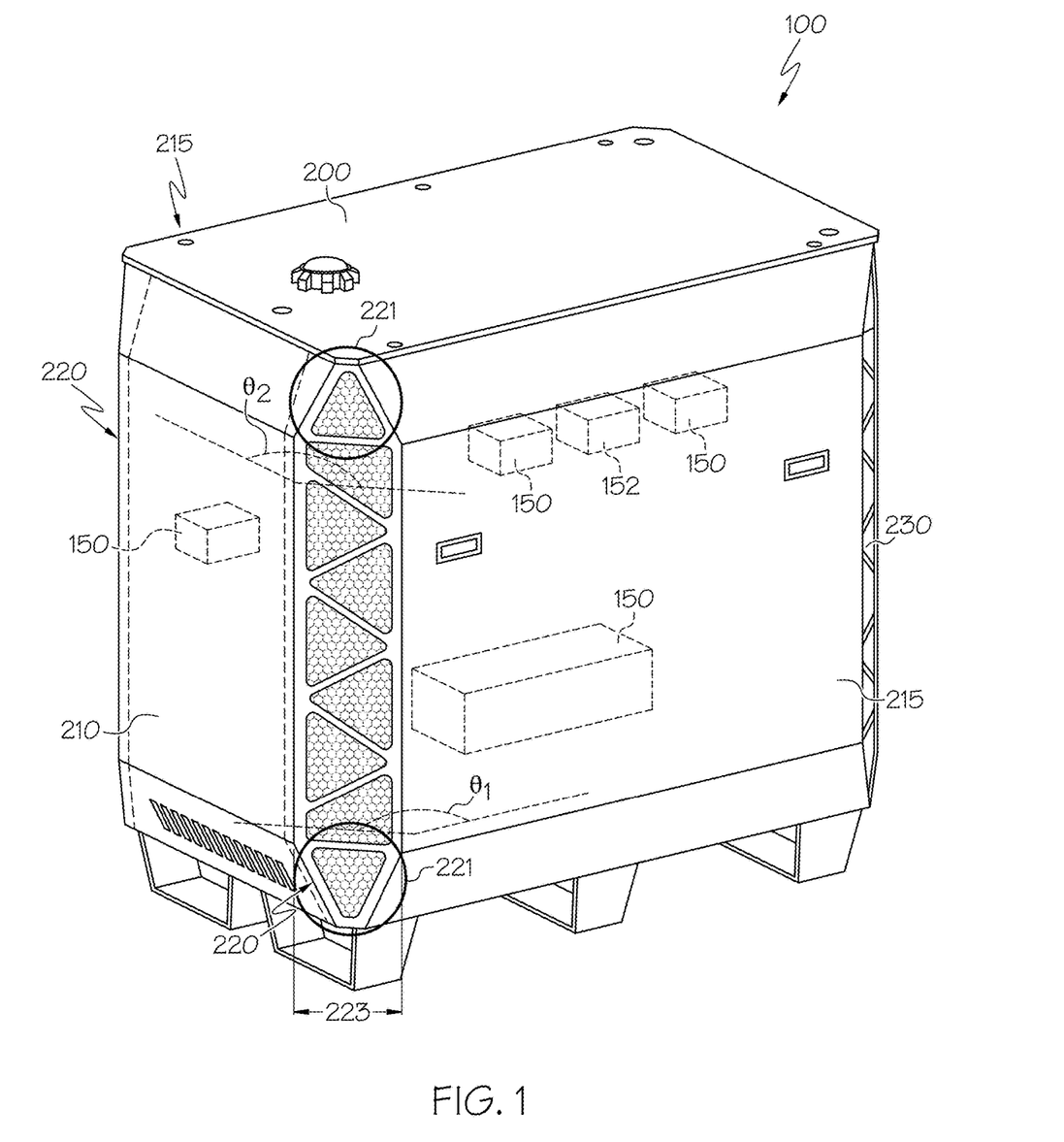
FIG. 1 is a perspective view of an example plasma cutting system power supply having air inlets disposed at non-zero angles with respect to a front panel and side panel.

For example, referring to FIG. 1, a power supply 100 for a plasma cutting system (e.g., a liquid cooled or mechanized plasma cutting system) can be configured to support generation of a plasma arc by a torch head connected to the power supply by a torch lead. The power supply 100 can include a set of electrical components 150 for plasma arc generation and a power supply housing 200 containing the set of electrical components 150. The power supply 100 can include a liquid coolant system (shown in the cutaway view of FIG. 3 as system 155) disposed within the housing 200 that can be configured to thermally regulate the torch head. For example, the liquid coolant system can be configured to provide a supply of liquid coolant to the torch head to cool one or more components (e.g., consumables) of the torch.

The power supply housing 200 includes a front panel 210 and at least two side panels 215. In some embodiments, the front panel 210 and side panels 215 define normal surfaces of the housing 200. The housing 200 defines a set of inlets 220 that allow a cooling gas (e.g., air) to enter the power supply housing 200 to thermally regulate the set of electrical components 150. That is, cooling gas can enter one or more inlets 220 to enter the housing 200 and pass over various electrical components 150 to convectively cool them. As discussed below, the cooling gas can be directed to flow through one or more defined cooling passages (e.g., circuits).

In some embodiments, at least one of the inlets 220 is positioned at a corner of the housing. In some cases, both inlets 220 are positioned at corners (e.g., adjacent corners) between the front panel 210 and the respective side panels 215. The inlets 220 can include a portion with a diminishing flow area 221. For example, as depicted, the portion with a diminishing flow area 221 can be disposed at an upper or lower end of the inlet. In some cases, the diminishing flow are 221 can be angled vertically inward relative to the normal surfaces of side panels 215 and front panel 210.

In some embodiments, one or more of the inlets 220 are oriented (e.g., positioned, arranged) at non-zero angles relative to one or more of the normal surfaces of the housing (e.g., the front panel 210 and/or the side panels 215). For example, the inlets 220 can form beveled corners along the housing. The inlets 220 can each be oriented at the same or different angles relative to a common panel (e.g., the front panel 210). In some embodiments, the two inlets 220 are arranged at the same angle $\theta_2$ from the front panel 210. For example, the two inlets 220 can be arranged at an angle $\theta_2$ of about 10 degrees to about 80 degrees (e.g., about 30 degrees to about 60 degrees (e.g., about 45 degrees)) from the front panel 210. The inlets 220 can additionally or alternatively be arranged at an angle $\theta_1$ of about 35 degrees to about 50 degrees (e.g., about 45 degrees) from the side panel 215. In some cases, the normal surfaces of the housing can substantially form a rectangle. For example, the front panel 210 can be arranged at about 80 degrees to about 100 degrees from the side panels 215. Due to the angled orientation, each inlet 220 (or vent 230 discussed below) forms a face having a width 223.

In some embodiments, the configuration of the angled cooling gas inlets can be useful in order to dispose the power supply in environments that would otherwise not be suitable for operation of a plasma cutting system power supply. For example, the positioning and orientation of the set of inlets as being positioned at a corner of the housing and oriented at a non-zero angle relative to the front and side panels can facilitate abutting the power supply in direct contact with at least one of an adjacent power supply or a wall structure along at least one of the front panel or side panels. That is, since the corners of a power supply housing are effectively removed, the housing can be placed up against another surface without blocking an in-flow of cooling gas.

The housing 200 also defines one or more vents (e.g., outlets) 230 to allow at least a portion of the cooling gas to exit the power supply housing 200. For example, the cooling gas can enter the inlets 220, flow through one or more cooling circuits (e.g., cooling tunnels, flow paths) to cool the electrical components, and be expelled from the housing 200 through the vents 230.

Like the inlets 220, the vents 230 can be oriented (e.g., positioned, arranged) at non-zero angles relative to one or more of the normal surfaces of the housing (e.g., the front panel 210 and/or the side panels 215). For example, the vents 230 can form beveled corners along the housing. The vents 230 can each be oriented at the same or different angles relative to a common panel (e.g., the front panel 210). In some embodiments, the vents 230 are arranged at the same angle $\theta_2$ from the front panel 210. For example, the two vents 230 can be arranged at an angle $\theta_2$ of about 10 degrees to about 80 degrees (e.g., about 30 degrees to about 60 degrees (e.g., about 45 degrees)) from the front panel 210. The vents 230 can additionally or alternatively be arranged at an angle $\theta_1$ of about 35 degrees to about 50 degrees (e.g., about 45 degrees) from the side panel 215.

As a result of the four normal surfaces (e.g., front panel, rear panel, and two side panels) substantially forming a rectangular box and the four beveled, angled corners, the housing can be configured to form an eight sided power supply housing. The angled inlets and access vents can increase air access to internal components (e.g., electrical components or liquid coolant handling components) and regions of the power supply and allow for the power supply to be positioned closer to other components, such as walls, corners, etc. than some conventional systems.

In some embodiments, the power supply is arranged in a two-inlet and two-outlet pattern such that two of the corners allow cooling gas into the power supply and two of the corners are venting heated air which has passed by, and cooled, the components. This arrangement provides multiple access points for cooling gas. In some embodiments, bottom sloping apertures can be included to further increase accessibility. For example, the lower portions of the side panels can slope inwardly, which provides more surface area that would not be blocked if system is placed close to a wall. These surfaces can be used for additional inlet/exhaust area. As such, in some embodiments the power supplies described herein can be placed right up against a wall in a manufacturing space.

Figure 5:
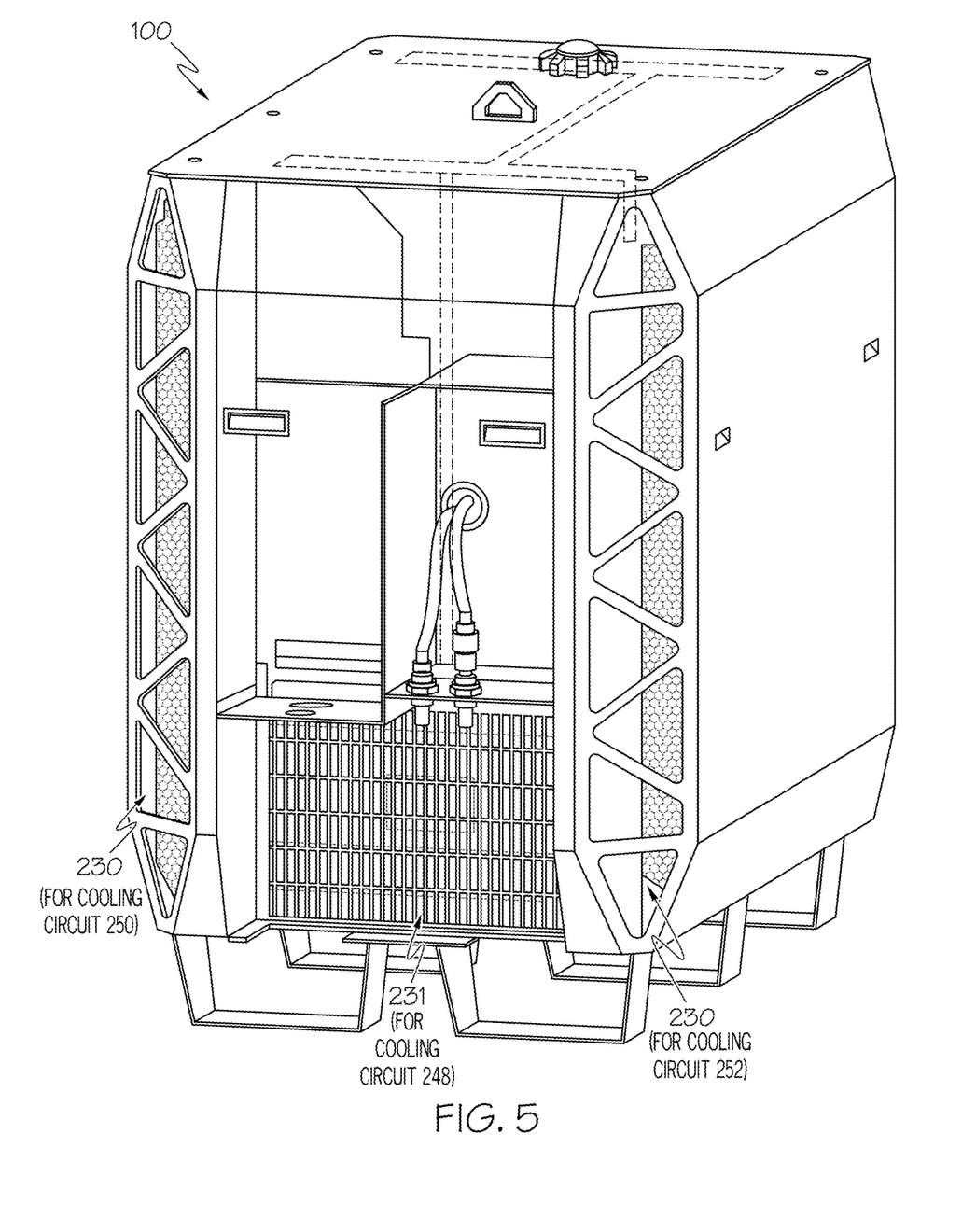
FIG. 5 is a perspective view of a rear portion of an example power supply with a rear panel removed, depicting a vent for a lower cooling circuit in addition to corner vents for other cooling circuits.

The housing 200 can also define a vent (or set of vents) 231 at a rear portion of the housing, which is depicted in the view of FIG. 5. In some cases, the vent along the rear portion can be substantially parallel to an outermost rear plane (e.g., rear panel). For example, the rear vent can be offset from a rear panel of the housing, which can be useful to limit the likelihood that placing the power supply in contact with another object, such as a wall or another power supply, would obstruct or block the cooling gas from being expelled from the housing. Thus, in some examples, the power supply housing can define three vents, where two vents are angled and positioned at the rear corners of the housing and one vent is substantially parallel to the rear panel. As depicted in FIG. 5, a vent 231 can provide an outlet for a first cooling circuit 248, one vent 230 can provide an outlet for a second cooling circuit 250, and another vent 230 can provide an outlet for a third cooling circuit 252.

In some embodiments, the vents (e.g., the angled vents and rear vents) can be fluidly connected to one another and the cooling circuits by way of a plenum (e.g., a rear plenum) that collects the cooling gas leaving the cooling circuits and distributes it through the vents. In some examples, certain vents can be dedicated to one or more cooling circuits. In some cases, a rear vent can be dedicated to a lower cooling circuit (e.g., the first cooling circuit) for cooling system magnetics.

Figure 2:
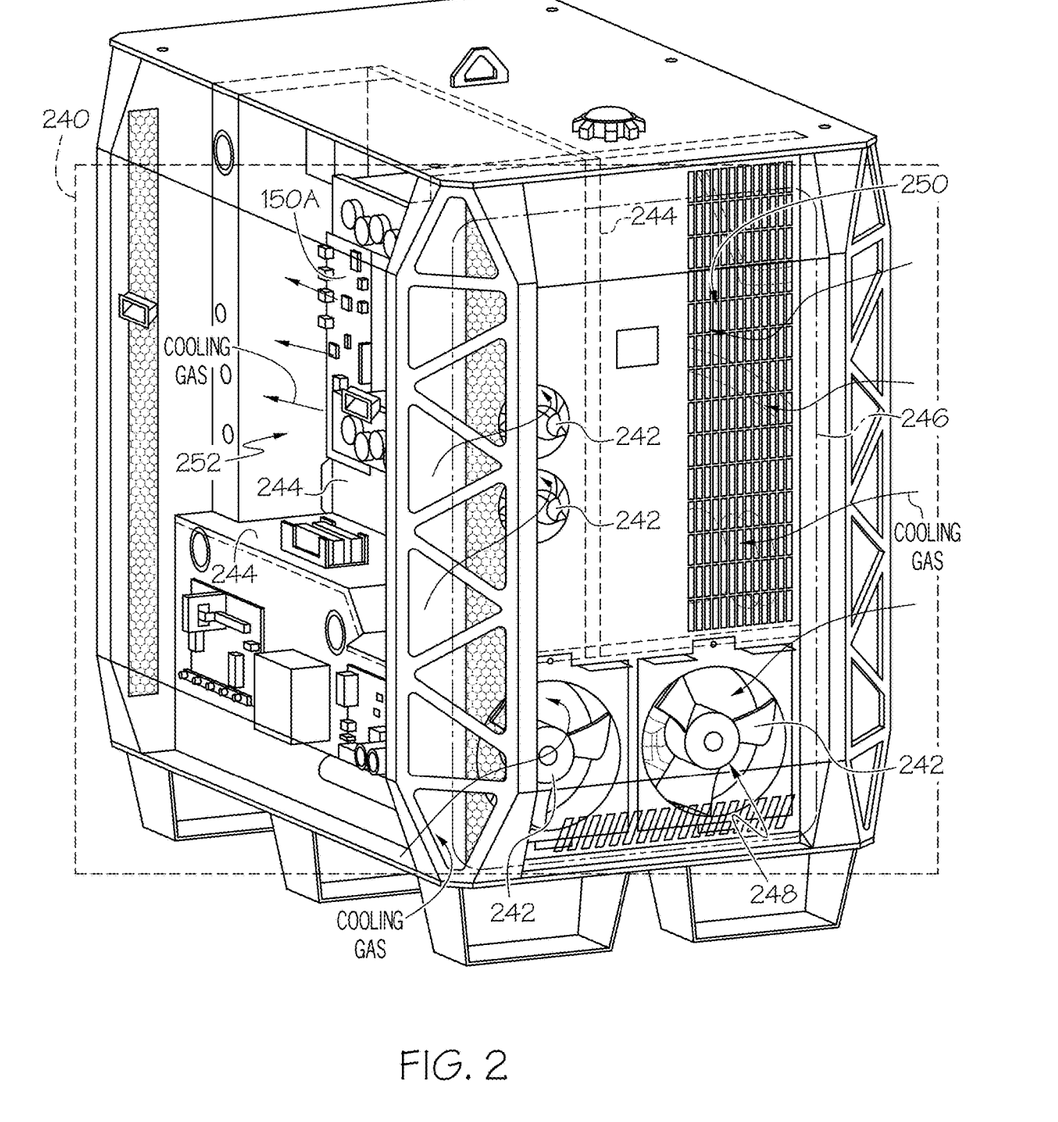
FIG. 2 is a perspective cutaway view of a power supply illustrating different cooling circuits.
Figure 3:
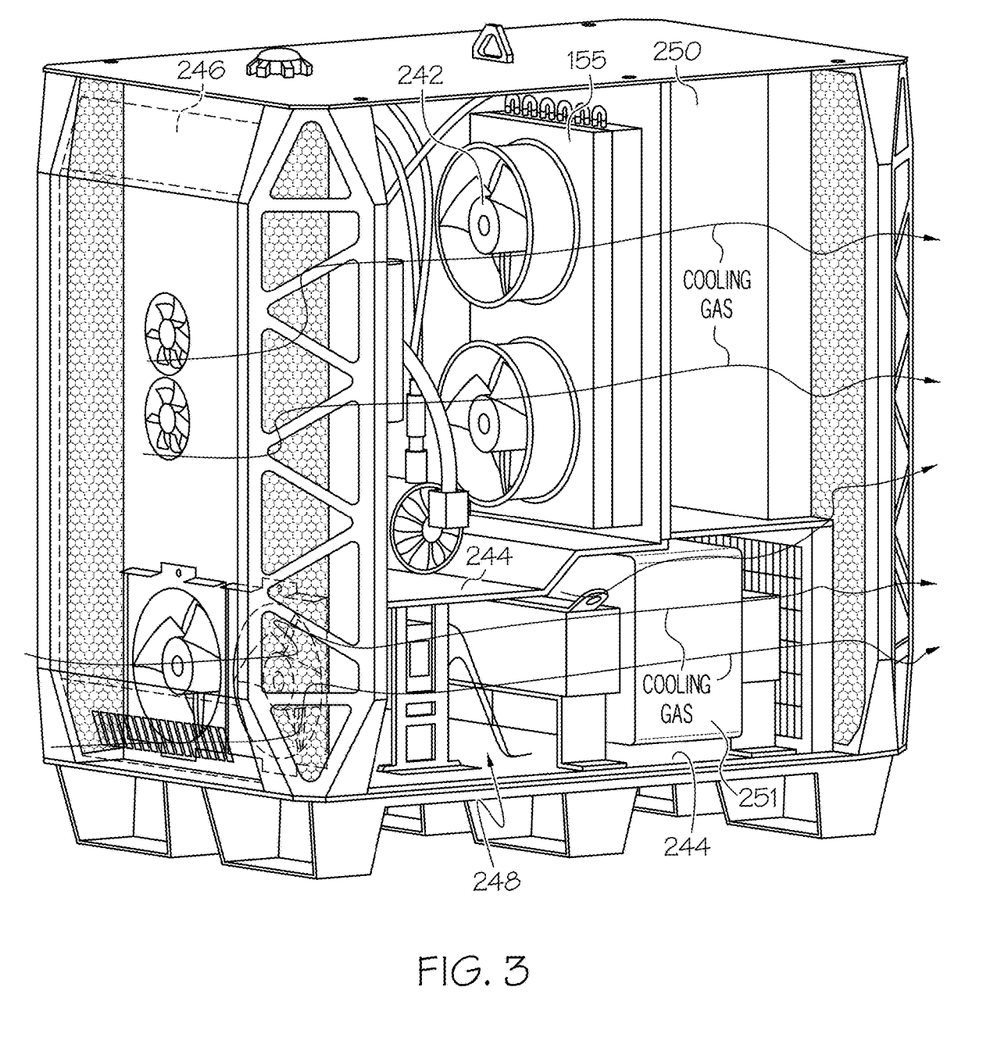
FIG. 3 is another perspective cutaway view of a power supply illustrating a magnetics cooling circuit and a liquid coolant handling cooling circuit.

Referring to FIGS. 2 and 3, in some embodiments, the power supply 100 can include a thermal regulation system 240 disposed within the power supply housing 200. The thermal regulation system 240 can be configured to generate a cooling flow of the cooling gas within (e.g., through) the housing 200 and to direct it along the set of electrical components. For example, the thermal regulation system 240 can include one or more physical partitions (e.g., baffles) 244 formed within the housing 200 to block and direct cooling gas between the inlets 220 and the vents 230/vents 231. The thermal regulation system 240 can also include fans 242 to direct the cooling gas through the spaces defined by the baffles 244. In some embodiments, baffles can be used to enclose cooling circuits such that portions of the housing (e.g., panels/covers) can be removed without disturbing the cooling circuits.

For example, in some embodiments, the thermal regulation system 240 includes a plenum (e.g., central plenum) 246 in fluid communication with the inlets 220 to receive the cooling gas entering the housing 200. From the plenum 246, the gas can be directed and distributed to any of various locations within the housing to cool components of the power supply. The thermal regulation system 240 can include a first cooling circuit 248 fluidly connected to the central plenum 246 to receive a supply of the cooling gas from the central plenum 246. In some cases, the first cooling circuit 248 can house and thermally regulate (e.g., cool) one or more sets of electrical components, such as system magnetics. In some cases, the system magnetics can be arranged horizontally within the first circuit. Such arrangement can help lower the center of gravity of the system, which reduces the likelihood that the power supply is inadvertently tipped over.

In some conventional systems, some components (e.g., relatively heavy components, such as inductors) are positioned along or near centerlines of the power supply for stability. However, in some embodiments, placement and orientation of the components (e.g., inductors) may be displaced relative to such conventional systems so that they are located not along a centerline but where cooling is optimal/improved. This can increase thermal performance based on where the airflow is delivered within the system and the specific cooling circuits.

In some embodiments, the thermal regulation system 240 includes a second cooling circuit 250 fluidly connected to the central plenum 246 to receive cooling gas from the plenum 246. The second cooling circuit 250 can be separated from other regions of the housing, such as the first cooling circuit 248 by one or more baffles 244. The second cooling circuit 250 can be configured to cool other components of the power supply 100, such as a liquid coolant system of the power supply to thermally regulate the torch head. In some cases, separating the liquid coolant system components (e.g., at least the components making liquid connections) into a different cooling circuit than some other electrical components can be useful in order to limit a leaking component from expelling liquid coolant onto electrical components. Separating the liquid coolant components cooling circuit can also to reduce or limit unwanted heat introduction from the liquid cooling circuit into the electronics environment. In some examples, the second cooling circuit 250 can be arranged vertically above the first cooling circuit 248 and fluidly separated therefrom by a horizontally arranged baffle 244.

In some embodiments, the thermal regulation system 240 can include a third cooling circuit 252 for thermal regulation of controls of the power supply. The third cooling circuit 252 can be in fluid communication with the central plenum 246 to receive a cooling gas flow. The third cooling circuit 252 can also be arranged vertically above the first cooling circuit 248 and fluidly separated there from via a horizontally arranged baffle 244. In some cases, a single horizontally arranged baffle can be disposed to partially define the first cooling circuit 248 and separate the first cooling circuit 248 from both the second cooling circuit 250 and the third cooling circuit 252. In some cases, the second cooling circuit 250 and the third cooling circuit 252 can be fluidly separated from one another by a vertically arranged baffle 244. For example, the first cooling circuit 248 can be disposed along a lower region of the housing 200 and the second and third cooling circuits 250, 252 can be disposed along an upper region of the housing 200.

The cooling circuits can be shaped (e.g., funneled, choked, etc.) to drive and/or modify flows of cooling gases throughout. In some embodiments, the different cooling circuits can include different sizes or shapes (e.g., a cross-sectional areas or shapes). In some cases, the circuits' size or shape can vary between the inlet 220 and the vent 230/vent 231. Some cooling circuits can have a smaller cross sectional area at the inlet and then gradually and/or abruptly increase their cross sectional area proximate the vent. Some cooling circuits can have a larger cross sectional area at the inlet and then gradually and/or abruptly decrease their cross sectional area proximate the vent. Varying sizes and shapes can be implemented to accommodate different types and arrangements of components within the circuits. As a result, the circuits can be designed and configured to house specific components, which may have different and particular cooling requirements.

Thus, the circuits can include one or more fans 242 (e.g., dedicated fans) that can be configured to drive the cooling gas through the respective cooling circuit. In some cases, the fans 242 are sized according to the cooling needs. For example, if the components in the area being cooled produce more heat than the components in the adjacent area, these fans have a higher cubic feet per minute (cfm) compared to the fans in the adjacent area. One or multiple fans in each area can be used to obtain the required cooling capacity. For example, a fan or fans dedicated for the first cooling circuit can be configured to generate a flow that is about 10 cubic feet per minute (cfm) to about 5000 cfm (e.g., about 200 cfm to about 3500 cfm (e.g., about 1500 cfm to about 1800 cfm)). In some cases, the first cooling circuit can have two dedicated fans that combined are configured to generate a cooling gas flow that is about 1600 cfm (e.g., two fans at about 890 cfm).

A fan or fans dedicated for the second cooling circuit can be configured to generate a flow that is about 0 cubic feet per minute (cfm) to about 1200 cfm (e.g., about 200 cfm to about 900 cfm (e.g., about 580 cfm in cases with two fans)). A fan or fans dedicated for the third cooling circuit can be configured to generate a flow that is about 10 cubic feet per minute (cfm) to about 5000 cfm (e.g., about 200 cfm to about 3500 cfm (e.g., 1500 cfm to about 1800 cfm (e.g., two fans rated at about 890 cfm))).

The dedicated cooling circuits can be designed and controlled (e.g., to have a certain size and fans) based on their needs, such as to be responsive to component tolerances and thermal conditions within those circuits. Using separate cooling circuits for different types of components, where each circuit is driven by dedicated fans can help provide more customized cooling of components. For example, some components run particularly hot during use, which can be cooled with liquid. In order to maintain the adequate liquid temperature for cooling, the fans on the heat exchanger can be sized to meet the needs of that circuit without the added constraints of the components in the other circuits. In some cases, the cooling circuit housing liquid handling components can have the most powerful fans due to the highest heat to be removed compared to the other circuits. Compared to the cooling circuits housing electronic controls, the liquid handling cooling circuit can have more than 3 times the amount of heat to remove from the components it is cooling. Hence 3 times the cfm of the fans can be used. As such, the cooling circuit containing the controls electronics can be configured to have a lower cooling gas flow than one or more of the other cooling circuits.

Additionally, in some embodiments, operation of particular fans within a cooling circuit can be customized based on operation of the power supply and temperature of the components. For example, electrical components can be monitored to track their temperature and the fans can be selectively operated based on the monitored temperature. In some cases, fans within a circuit can be configured to operate (e.g., turn on) based on one or more components therein reaching a certain threshold temperature. In some cases, the fans can be configured to operate at variable speeds that can increase and decrease based on the temperature of the electrical components and the associated cooling needs.

In some examples, the set of electrical components within the power supply can include a set of system magnetics 151 disposed horizontally within a lower cooling circuit of the power supply (e.g., the first cooling circuit 248) and a set of control circuitry 150A disposed in a first upper cooling circuit of the power supply (e.g., the third cooling circuit 252), and wherein the liquid coolant system 155 is disposed in a second upper cooling circuit (e.g., the second cooling circuit 250) arranged horizontally relative to the first upper cooling circuit (e.g., the third cooling circuit 252).

Figure 4:
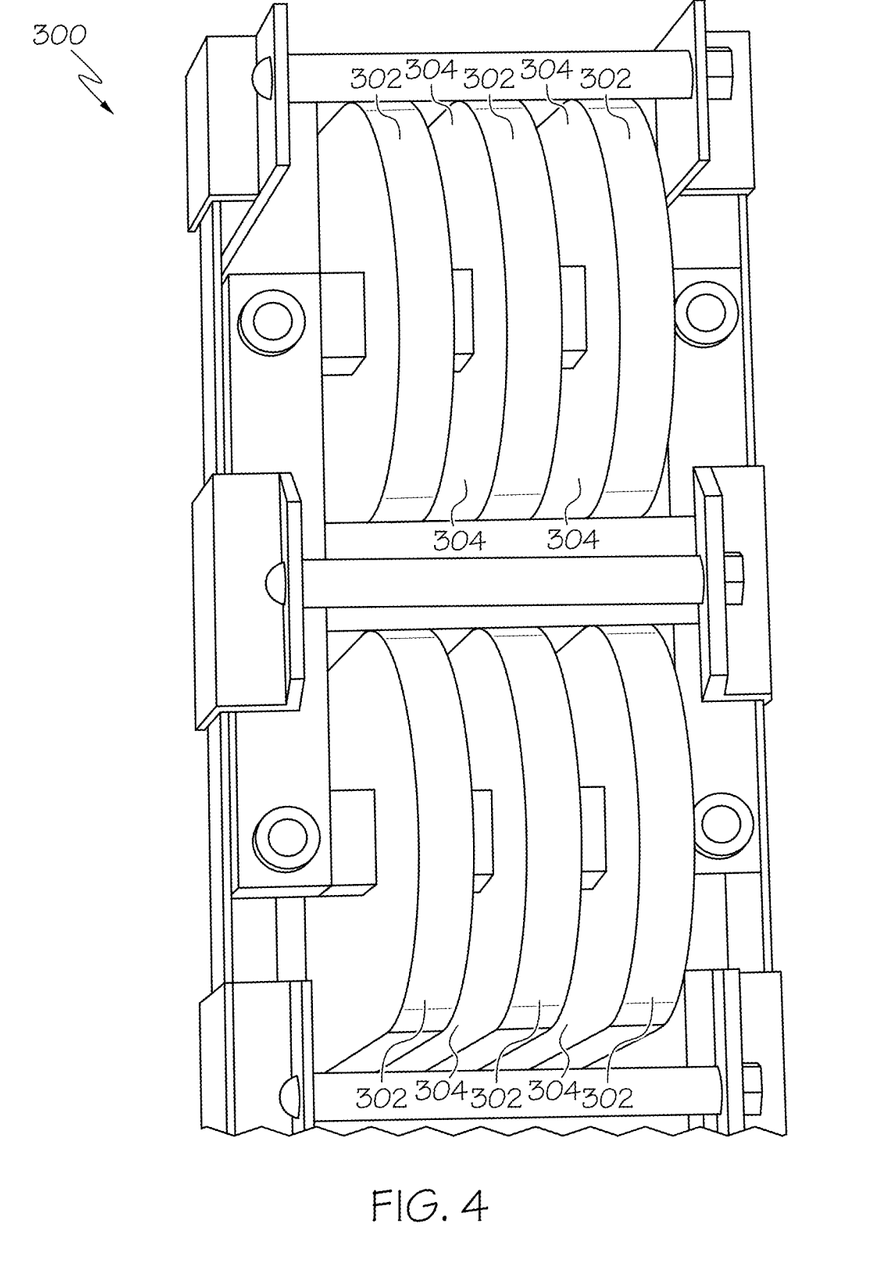
FIG. 4 is a perspective view of an example disk inductor having multiple cooling ducts defined by inductor windings.

As discussed above, in some embodiments, the set of electrical components includes a set of magnetic components, such as inductors, or transformers (e.g., main transformer). Referring to FIG. 4, in some embodiments, magnetic components 300 are configured to allow the cooling gas to flow therethrough. For example, the magnetic components 300 can include one or more inductor coil disks 302 wound to define ducts 304 to promote cooling of the magnetic components and to allow the cooling gas to flow therethrough. In some embodiments, the ducts 304 can be at least about 0.5 inches wide. In some cases, a coil wire size is about 1.578 mm (thick) by about 11.81 mm (wide). In such cases, a minimum duct width can be about 11.81 mm (e.g., about 0.46 inches) for the coil to be wound in disk style. In some cases, a maximum size of the duct can be limited by the core window width and total number of disk layers. For example, duct sizes (e.g., widths) of 1" have also been observed in different prototype samples. In some cases, the ducts 304 can be at least as wide as the coil disks 302. In some examples, the disk layer ducts have large surface cooling area leading to more efficient cooling of the coil. Forming inductor coil disks that create substantially planar surfaces between which cooling gas can flow can effectively form heat sinks from the inductor coils. Winding the inductor in the form of coil disks 302 can lead to the creation of ducts between the adjacent disk layers. In such examples, duct spacing is achieved without additional devices, such as spacers, which can lead to further cost and weight savings.

Forming ducts through the magnetic components can help increase the rate of cooling of the magnetic components. As such, the magnetic components can be manufactured to be smaller and more compact. These magnetic components formed of disk winding that form ducts to cool the components can be more efficient than some conventional inductors due to the availability of a wide variety of large cross-sectional area coil wires with high aspect ratios (width/thickness ratios). This can help the entire inductor coil to be accommodated with a smaller (e.g., minimum) number of disk layers, while keeping winding loss under control. Additionally, in some cases, the absence of spacers can increase the duct cooling area, which can further improve cooling efficiency. Thus, more compact magnetic components can be manufactured due to these factors, which can reduce manufacturing and shipping costs.

The systems described herein can be used to carry out various selective and customized cooling sequences. For example, methods of selectively thermally regulating one or more components within a power supply for a mechanized or liquid cooled plasma cutting system can include drawing a cooling gas through one or more inlets (e.g., inlets 220) of a power supply housing (e.g., the housing 200) into a plenum (e.g., the central plenum 246) at least partially defined by the housing. In some embodiments, cooling gas can be drawn into the housing through two inlets at adjacent corners along the front of the housing. As discussed above, the inlets can be oriented at non-zero angles relative to a front panel (e.g., front panel 210) and at least one side panel (e.g., side panels 215).

Once cooling gas has entered the housing and the plenum, it can be distributed through the housing to cool the various components. For example, the methods can include causing some (e.g., at least a portion) of the cooling gas to be drawn through a first cooling circuit fluidly connected to one or more inlets for thermal regulation of a set of electrical components of the power supply. In some cases, the cooling circuits can be fluidly connected to the inlets via the plenum. Alternatively or additionally, the cooling circuits can be directly connected to a dedicated inlet without a joint plenum therebetween.

In some embodiments, as detailed above, the set of electrical components in the first cooling circuit includes a set of system magnetics (e.g., inductors). Therefore, for example, the thermal regulation of the system magnetics can include flowing a portion of the cooling gas through the first cooling circuit through an inductor coil wound to define a cooling passage (e.g., a duct). As discussed above, the thermal regulation can include flowing a portion of the cooling gas through one or more ducts 304 defined by inductor coil disks 302.

Additionally or alternatively, the methods can include causing some (e.g., at least a portion) of the cooling gas to be drawn through a second cooling circuit. The second cooling circuit can be fluidly connected to at least one of the inlets for thermal regulation of a second set of components of the power supply. The second cooling circuit can be directly fluidly connected to an inlet or can be fluidly connected via the plenum. The electrical components thermally regulated in the second cooling circuit can be exclusive of the set of electrical components within the first cooling circuit. As discussed above, the first and second cooling circuits can be separated (e.g., fluidly separated)

from one another by a partition or baffle 244. In some embodiments, as detailed above, the second set of components in the second cooling circuit can include liquid coolant handling components.

In some embodiments, the plenum can receive cooling gas from one or more inlets and distribute the gas between the different cooling circuits. For example, in some cases, the drawing the cooling gas through one or more inlets into a plenum includes drawing cooling gas though two inlets into a common plenum. The plenum typically serves as a conduit through which cooling gas can pass before being drawn into the cooling circuits. The causing at least a portion of the cooling gas to be drawn through a first cooling circuit can include drawing a portion of the cooling gas from the common plenum into the first circuit. Additionally, the causing at least a portion of the cooling gas to be drawn through a second cooling circuit can include drawing a second portion of the cooling gas from the common plenum into the second circuit.

As discussed above, cooling gas can be distributed through the different cooling circuits in different configurations in order to cool the different components therein at different rates. For example, the causing a portion of the cooling gas to be drawn through the second cooling circuit can include causing the cooling gas to flow through the second cooling circuit at a different rate (e.g., a higher or lower volumetric flow rate) than the cooling gas flowing through the first cooling circuit.

After passing through the cooling circuits, the cooling gas can be expelled (e.g., driven) from the housing through at least one vent defined along the housing. For example, the fans within the cooling circuits can draw cooling gas into the circuits through the inlets and then drive it out from circuits through the vents.

While various embodiments have been described herein, it should be understood that they have been presented and described by way of example only, and do not limit the claims presented herewith to any particular configurations or structural components. Thus, the breadth and scope of a preferred embodiment should not be limited by any of the above-described exemplary structures or embodiments, but should be defined only in accordance with the following claims and their equivalents.

What is claimed:

1. A power supply for a liquid cooled plasma cutting system configured to support generation of a plasma arc by a torch head connected to the power supply by a torch lead, the power supply comprising:
    a power supply housing containing a set of electrical components for plasma arc generation, the power supply housing having a front panel, a rear panel, at least two side panels, and at least one angled corner, wherein the front panel, rear panel, and at least two side panels define normal surfaces of the power supply housing and the at least one angled corner is beveled with respect to one of the at least two side panels and at least one of the front or rear panels, the power supply housing defining:
        a set of inlets for allowing a cooling gas to enter the power supply housing to thermally regulate the set of electrical components, at least one inlet of the set of inlets being positioned at the at least one angled corner of the housing;
        a set of vents for allowing at least a portion of the cooling gas to exit the power supply housing;
        a set of cooling circuits, each cooling circuit fluidly connected to the set of inlets and the set of vents, each cooling circuit substantially fluidly separate from each other; and
    wherein individual electrical components of the set of electrical components are positioned within a higher capacity cooling circuit or a lower capacity cooling circuit, such that cooling requirements of the individual electrical components in the higher capacity cooling circuit are greater than cooling requirements of the individual electrical components in the lower capacity cooling circuit.

2. The power supply of claim 1 further comprising a liquid coolant system disposed within the power supply housing and configured to thermally regulate the torch head.

3. The power supply of claim 1 further comprising a thermal regulation system disposed within the power supply housing and configured to generate a cooling flow of the cooling gas within the housing and direct it along the set of electrical components.

4. The power supply of claim 3 wherein the thermal regulation system comprises at least one fan and one or more baffles formed within the housing.

5. The power supply of claim 3 wherein the thermal regulation system comprises a central plenum in fluid communication with the set of inlets, a first cooling circuit fluidly connected to, and receiving a supply of the cooling gas from, the central plenum for thermal regulation of electrical components comprising system magnetics; and a second cooling circuit fluidly connected to, and receiving a supply of the cooling gas from, the central plenum for thermal regulation of a liquid coolant system of the power supply to thermally regulate the torch head.

6. The power supply of claim 5 wherein the thermal regulation system further comprises a third cooling circuit for thermal regulation of controls of the power supply.

7. The power supply of claim 5 wherein the first cooling circuit and/or the second cooling circuit comprises a cross-sectional area or shape that varies between the inlet and the vent.

8. The power supply of claim 5 wherein the first cooling circuit and the second cooling circuit comprise at least one dedicated fan configured to drive a first cooling gas and a second cooling gas through the respective cooling circuit.

9. The power supply of claim 2 wherein the set of electrical components include a set of system magnetics disposed horizontally within a lower cooling circuit of the power supply and a set of control circuitry disposed in a first upper cooling circuit of the power supply, and wherein the liquid coolant system is disposed in a second upper cooling circuit arranged horizontally relative to the first upper cooling circuit.

10. The power supply of claim 1 wherein the set of electrical components includes a set of magnetic components, the magnetic components being configured to allow the cooling gas to flow therethrough.

11. The power supply of claim 10 wherein the magnetic components comprise an inductor coil wound to define a duct to promote cooling of the magnetic components and to allow the cooling gas to flow therethrough.

12. The power supply of claim 1 wherein at least one inlet of the set of inlets comprises a portion with a diminishing flow area.

13. The power supply of claim 12 wherein the portion with a diminishing flow area is disposed at an upper or lower end of the inlet.

14. The power supply of claim 1 wherein the positioning and orientation of the at least one inlet of the set of inlets positioned at a corner of the housing and oriented at a non-zero angle relative to the front panel and to at least one of the two side panels facilitates abutting the power supply in direct contact with at least one of an adjacent power supply or a wall structure along at least one of the front panel or side panels.

15. The power supply of claim 1 wherein at least one vent of the set of vents is positioned at a corner of the housing and oriented at a non-zero angle relative to the front panel and to at least one of the two side panels.

16. A plasma cutting system configured to support generation of a plasma arc by a torch head connected to a power supply by a torch lead, the plasma cutting system comprising:
the power supply comprising:
a set of electrical components for plasma arc generation; and
a power supply housing containing the set of electrical components, the power supply housing having a front panel, a rear panel, at least two side panels, and at least one angled corner, wherein the front panel, rear panel, and at least two side panels define normal surfaces of the power supply housing and the at least one angled corner is beveled with respect to one of the at least two side panels and at least one of the front or rear panels, the power supply housing defining:
a set of cooling circuits fluidly connected to a set of inlets and a set of vents, wherein the cooling circuits are substantially fluidly separate from each other;
the set of inlets allowing a cooling gas to enter the power supply housing and thermally regulate the set of electrical components, the set of inlets being positioned at the at least one angled corner of the housing;
the set of vents allowing at least a portion of the cooling gas to exit the power supply housing, at least one vent of the set of vents being oriented at a non-zero angle relative to the front panel and to at least one of the two side panels; and
a thermal regulation system disposed within the power supply housing and configured to generate a cooling flow of the cooling gas within the housing and direct it along the set of electrical components, the thermal regulation system comprising:
a central plenum in fluid communication with the set of inlets, a first cooling circuit fluidly connected to, and receiving a supply of the cooling gas from, the central plenum for thermal regulation of electrical components comprising system magnetics; and a second cooling circuit fluidly connected to, and receiving a supply of the cooling gas from, the central plenum for thermal regulation of a liquid coolant system of the power supply to thermally regulate the torch head.

17. A method of selectively thermally regulating one or more components within a power supply for a plasma cutting system configured to support generation of a plasma arc by a torch head connected to the power supply by a torch lead, the method comprising:
drawing a cooling gas through one or more inlets of a power supply housing into a plenum at least partially defined by the housing, at least one inlet being positioned at an angled corner of the housing, wherein the angled corner is beveled with respect to at least one of at least two side panels of the housing and at least one of a front panel or a rear panel, wherein the front panel, rear panel, and at least two side panels define normal surfaces of the power supply housing;
causing at least a portion of the cooling gas to be drawn through a first cooling circuit fluidly connected to at least one of the inlets for thermal regulation of a first set of electrical components of the power supply;
causing at least a portion of the cooling gas to be drawn through a second cooling circuit fluidly connected to at least one of the inlets for thermal regulation of a second set of electrical components of the power supply that is exclusive of the set of electrical components within the first cooling circuit, the second cooling circuit being substantially fluidly separated from the first cooling circuit, wherein the first and second set of electrical components are positioned within the first and second cooling circuits dependent on the cooling requirements of the first and second set of electrical components; and
expelling the cooling gas from the housing through at least one vent defined along the housing.

18. The method of claim 17 wherein the set of electrical components in the first cooling circuit comprises a set of system magnetics and the second set of components in the second cooling circuit comprises liquid coolant handling components.

19. The method of claim 17 wherein the causing at least a portion of the cooling gas to be drawn through the second cooling circuit comprises causing the cooling gas to flow through the second cooling circuit at a different rate than the cooling gas flowing through the first cooling circuit.

20. The method of claim 18 wherein the thermal regulation of the system magnetics comprises flowing a portion of the cooling gas through the first cooling circuit through an inductor coil wound to define a duct.

21. The method of claim 17 wherein:
the drawing the cooling gas through one or more inlets of a power supply housing into a plenum comprises drawing cooling gas though two inlets into a common plenum;
the causing at least a portion of the cooling gas to be drawn through a first cooling circuit comprises drawing a portion of the cooling gas from the common plenum into the first circuit; and
the causing at least a portion of the cooling gas to be drawn through a second cooling circuit comprises drawing a second portion of the cooling gas from the common plenum into the second circuit.

22. The power supply of claim 8, wherein a first flow of the first cooling gas is larger than a second flow of the second cooling gas.

23. The power supply of claim 22, wherein the first flow of the first cooling gas is at least twice as great as the second flow of the second cooling gas.

24. The power supply of claim 8, wherein the at least one dedicated fan is sized according to the cooling requirements of the cooling circuit.

25. The power supply of claim 1, wherein the power supply housing comprises two angled corners, wherein each angled corner is beveled with respect to one of the at least two side panels and at least one of the front or rear panels.

* * * * *